(12) United States Patent
Hsu

(10) Patent No.: US 7,718,591 B2
(45) Date of Patent: May 18, 2010

(54) MICROELECTRONIC CLEANING COMPOSITIONS CONTAINING AMMONIA-FREE FLUORIDE SALTS FOR SELECTIVE PHOTORESIST STRIPPING AND PLASMA ASH RESIDUE CLEANING

(75) Inventor: Chien-Pin S. Hsu, Basking Ridge, NJ (US)

(73) Assignee: Mallinckrodt Baker, Inc., Phillipsburg, NJ (US)

( * ) Notice: Subject to any disclaimer, the term of this patent is extended or adjusted under 35 U.S.C. 154(b) by 574 days.

(21) Appl. No.: 11/762,087

(22) Filed: Jun. 13, 2007

(65) Prior Publication Data

US 2007/0232513 A1 Oct. 4, 2007

Related U.S. Application Data

(62) Division of application No. 10/483,036, filed as application No. PCT/US02/21436 on Jul. 8, 2002, now Pat. No. 7,247,208.

(60) Provisional application No. 60/304,033, filed on Jul. 9, 2001.

(51) Int. Cl.
C11D 7/32 (2006.01)
(52) U.S. Cl. .................. 510/175; 510/176; 134/2
(58) Field of Classification Search ................ 510/175, 510/176; 134/2
See application file for complete search history.

(56) References Cited

U.S. PATENT DOCUMENTS

| | | | |
|---|---|---|---|
| 4,744,834 A | 5/1988 | Haq | |
| 5,091,103 A | 2/1992 | Dean | |
| 5,308,745 A | 5/1994 | Schwartzkopf | |
| 5,320,709 A | 6/1994 | Bowden et al. | |
| 5,417,877 A | 5/1995 | Ward | |
| 5,478,436 A | 12/1995 | Winebarger et al. | |
| 5,563,119 A | 10/1996 | Ward | |
| 5,571,447 A | 11/1996 | Ward et al. | |
| 5,698,503 A | 12/1997 | Ward et al. | |
| 5,709,756 A | 1/1998 | Ward et al. | |
| 5,783,495 A | 7/1998 | Li et al. | |
| 5,855,811 A | 1/1999 | Grieger et al. | |
| 5,962,385 A | 10/1999 | Maruyana et al. | |
| 6,043,005 A | 3/2000 | Haq | |
| 6,044,851 A | 4/2000 | Grieger et al. | |
| 6,103,680 A | 8/2000 | Honda et al. | |
| 6,110,881 A | 8/2000 | Lee et al. | |
| 6,192,899 B1 | 2/2001 | Li et al. | |
| 6,211,126 B1 | 4/2001 | Wojtczak et al. | |
| 6,225,030 B1 | 5/2001 | Tanabe et al. | |
| 6,248,704 B1 | 6/2001 | Small et al. | |
| 6,265,309 B1 | 7/2001 | Gotoh et al. | |
| 6,320,709 B1 | 11/2001 | Kitabayashi et al. | |
| 6,627,587 B2 | 9/2003 | Naghshineh et al. | |
| 6,638,899 B1 | 10/2003 | Wakiya et al. | |
| 6,703,319 B1 | 3/2004 | Yates et al. | |
| 6,773,873 B2 * | 8/2004 | Seijo et al. | 430/329 |
| 7,247,208 B2 * | 7/2007 | Hsu | 134/3 |
| 7,393,819 B2 * | 7/2008 | Hsu | 510/175 |
| 2001/0025017 A1 | 9/2001 | Amemiya et al. | |
| 2001/0032829 A1 | 10/2001 | Honda et al. | |
| 2001/0050350 A1 | 12/2001 | Wojtczak et al. | |
| 2002/0013240 A1 | 1/2002 | Sahbari | |
| 2002/0037820 A1 | 3/2002 | Small et al. | |
| 2003/0022800 A1 * | 1/2003 | Peters et al. | 510/175 |
| 2003/0130149 A1 | 7/2003 | Zhou et al. | |
| 2003/0181342 A1 * | 9/2003 | Seijo et al. | 510/175 |
| 2003/0207777 A1 | 11/2003 | Naghshineh et al. | |
| 2004/0009883 A1 * | 1/2004 | Ikemoto et al. | 510/175 |
| 2004/0149309 A1 * | 8/2004 | Hsu | 134/3 |
| 2004/0152608 A1 * | 8/2004 | Hsu | 510/175 |
| 2004/0220065 A1 * | 11/2004 | Hsu | 510/175 |
| 2005/0202987 A1 | 9/2005 | Small et al. | |
| 2005/0215446 A1 | 9/2005 | Wojtezak et al. | |
| 2005/0239673 A1 | 10/2005 | Hsu | |
| 2005/0288199 A1 * | 12/2005 | Oowada et al. | 510/175 |
| 2006/0154839 A1 * | 7/2006 | Ilardi et al. | 510/175 |
| 2006/0237392 A1 * | 10/2006 | Auger et al. | 216/83 |
| 2006/0293208 A1 * | 12/2006 | Egbe et al. | 510/407 |
| 2007/0060490 A1 * | 3/2007 | Skee | 510/175 |
| 2007/0066502 A1 * | 3/2007 | Brainard et al. | 510/175 |
| 2007/0078073 A1 * | 4/2007 | Auger | 510/175 |

(Continued)

FOREIGN PATENT DOCUMENTS

EP 0 690 483 6/1995

(Continued)

OTHER PUBLICATIONS

Patent Abstracts of Japan, vol. 2000, No. 16, May 8, 2001 of JP 2001 005201, Jan. 12, 2001.

*Primary Examiner*—Gregory E Webb
(74) *Attorney, Agent, or Firm*—George W. Rauchfuss, Jr.; Ohlandt, Greeley, Ruggiero & Perle LLP

(57) ABSTRACT

Ammonia-free, HF-free cleaning compositions for cleaning photoresist and plasma ash residues from microelectronic substrates, and particularly to such cleaning compositions useful with and having improved compatibility with microelectronic substrates characterized by sensitive porous and low-κ to high-κ dielectrics and copper metallization. The cleaning composition contain one or more non-ammonium producing, non-HF producing fluoride salt (non ammonium, quaternary ammonium fluoride salt) in a suitable solvent matrix.

6 Claims, No Drawings

U.S. PATENT DOCUMENTS

| | | | |
|---|---|---|---|
| 2009/0082240 A1* | 3/2009 | Nukui et al. | 510/176 |
| 2009/0163396 A1* | 6/2009 | Hsu | 510/176 |

FOREIGN PATENT DOCUMENTS

| | | |
|---|---|---|
| EP | 0 662 705 | 7/1995 |
| EP | 0 678 571 | 10/1995 |
| EP | 0 773 480 | 5/1997 |
| EP | 0 901 160 | 3/1999 |
| JP | 2001 005201 | 1/2001 |
| WO | WO 88 05813 | 8/1988 |
| WO | WO 94 05766 | 3/1994 |
| WO | WO 98 16330 | 4/1998 |
| WO | WO 98 30677 | 7/1998 |
| WO | WO 99/60083 | 11/1999 |
| WO | WO 99 60448 | 11/1999 |
| WO | WO 00/66697 | 11/2000 |
| WO | WO 01/01474 | 1/2001 |
| WO | WO 01/05524 | 1/2001 |
| WO | WO 01/29284 | 4/2001 |
| WO | WO 01 40425 | 6/2001 |
| WO | WO 02 33033 | 4/2002 |
| WO | WO 02 45148 | 6/2002 |

* cited by examiner

US 7,718,591 B2

MICROELECTRONIC CLEANING COMPOSITIONS CONTAINING AMMONIA-FREE FLUORIDE SALTS FOR SELECTIVE PHOTORESIST STRIPPING AND PLASMA ASH RESIDUE CLEANING

RELATED APPLICATIONS

This Application is a Divisional Application of U.S. application Ser. No. 10/483,036 filed Jan. 6, 2004, now U.S. Pat. No. 7,247,208 which is the US National Stage Application of PCT Application No. PCT/US02/21436, filed Jul. 8, 2002, claiming priority from U.S. Provisional Application No. 60/304,033, filed Jul. 9, 2001.

FIELD OF THE INVENTION

This invention relates to ammonia-free fluoride salt containing cleaning compositions for cleaning microelectronic substrates, and particularly to such cleaning compositions useful with and having improved compatibility with microelectronic substrates characterized by sensitive porous and low-κ and high-κ dielectrics and copper metallization. The invention also relates to the use of such cleaning compositions for stripping photoresists, cleaning residues from plasma generated organic, organometallic and inorganic compounds, and cleaning residues from planarization processes, such as chemical mechanical polishing (CMP), as well as an additive in planarization slurry residues.

BACKGROUND TO THE INVENTION

Many photoresist strippers and residue removers have been proposed for use in the microelectronics field as downstream or back end of the manufacturing line cleaners. In the manufacturing process a thin film of photoresist is deposited on a wafer substrate, and then circuit design is imaged on the thin film. Following baking, the unpolymerized resist is removed with a photoresist developer. The resulting image is then transferred to the underlying material, which is generally a dielectric or metal, by way of reactive plasma etch gases or chemical etchant solutions. The etchant gases or chemical etchant solutions selectively attack the photoresist-unprotected area of the substrate. As a result of the plasma etching process, photoresist, etching gas and etched material by-products are deposited as residues around or on the sidewall of the etched openings on the substrate.

Additionally, following the termination of the etching step, the resist mask must be removed from the protected area of the wafer so that the final finishing operation can take place. This can be accomplished in a plasma ashing step by the use of suitable plasma ashing gases or wet chemical strippers. Finding a suitable cleaning composition for removal of this resist mask material without adversely affecting, e.g., corroding, dissolving or dulling, the metal circuitry has also proven problematic.

As microelectronic fabrication integration levels have increased and patterned microelectonic device dimensions have decreased, it has become increasingly common in the art to employ copper metallizations, low-κ and high-κ dielectrics. These materials have presented additional challenges to find acceptable cleaner compositions. Many process technology compositions that have been previously developed for "traditional" or "conventional" semiconductor devices containing Al/SiO$_2$ or Al(Cu)/SiO$_2$ structures cannot be employed with copper metallized low-κ or high-κ dielectric structures. For example, hydroxylamine based stripper or residue remover compositions are successfully used for cleaning devices with Al metallizations, but are practically unsuitable for those with copper metallizations. Similarly, many copper metallized/low-κ strippers are not suitable for Al metallized devices unless significant adjustments in the compositions are made.

Removal of these etch and/or ash residues following the etch and/or ashing process has proved problematic. Failure to completely remove or neutralize these residues can result in the absorption of moisture and the formation of undesirable materials that can cause corrosion to the metal structures. The circuitry materials are corroded by the undesirable materials and produce discontinuances in the circuitry wiring and undesirable increases in electrical resistance.

The current back end cleaners show a wide range of compatibility with certain, sensitive dielectrics and metallizations, ranging from totally unacceptable to marginally satisfactory. Many of the current strippers or residue cleaners are not acceptable for advanced interconnect materials such as porous and low-κ and high-κ dielectrics and copper metallizations. Additionally, the typical alkaline cleaning solutions employed are overly aggressive towards low-κ and high-κ dielectrics and/or copper metallizations. Moreover, many of these alkaline cleaning compositions contain organic solvents that show poor product stability, especially at higher pH ranges and at higher process temperatures.

BRIEF SUMMARY OF THE INVENTION

There is, therefore, a need for microelectronic cleaning compositions suitable for back end cleaning operations which compositions are effective cleaners and are applicable for stripping photoresists and cleaning plasma ash residues from plasma process generated organic, organometallic and inorganic materials. This invention relates to compositions that are effective in stripping photoresists, preparing/cleaning ashed semiconductor surfaces and structures with good compatibility with advanced interconnect materials and copper metallizations.

It has been discovered that ammonia (NH$_3$) and ammonia-derived salts, such as NH$_4$X where X is fluoride, fluoroborate or the like, are capable of dissolving/corroding metals such as copper through complex formation. Thus they are poor choices to be used in semiconductor cleaning formulations when compatibility of porous and low-κ dielectrics and copper metallizations are required. These compounds can generate ammonia through equilibrium process. Ammonia can form complex with metals such as copper and result in metal corrosion/dissolution as set forth in the following possible equations.

$$NH_4F \leftrightarrow NH_3 + HF \qquad \text{(Equation 1)}$$

$$2NH_4F + H_2O \rightarrow NH_3 + NH_4F \cdot HF \qquad \text{(Equation 2)}$$

$$Cu + 2NH_3 \rightarrow [Cu(NH_3)_2]^+ \rightarrow [Cu(NH_3)_2]^{2+} \qquad \text{(Equation 3)}$$

Thus, ammonium fluoride can provide nucleophilic and metal-chelating ammonia (NH$_3$) through the equilibrium process described in Equation 1 or 2, particularly when other bases such as amines and alkanolamines are added. In the presence of oxygen, metals such as copper can be dissolved/corroded through complex formation with ammonia, as described in Equation 3. Such complex formation can further shift the equilibrium (Equation 1 or 2) to the right, and provide more ammonia, leading to higher metal dissolution/corrosion.

Hydrofluoric acid (HF) attacks and destroys sensitive low-κ dielectrics, such as hydrogen silsequioxane (HSQ) and methyl silsequioxane (MSQ), especially at acidic pH ranges. The presence of HF, even at small percentages, can be very harmful. Ammonia and ammonia-derived salts also show poor compatibility with sensitive dielectrics, such as hydrogen silsesquioxane (HSQ) and methyl silsesquioxane (MSQ). Again, they can provide ammonia and/or other nucleophiles, and thus lead to reaction/degradation of sensitive dielectrics. Fluoride salts derived from primary or secondary amines are undesirable for sensitive low-κ dielectrics. They can provide efficient nucleophiles, such as the corresponding primary and secondary amines, through mechanisms similar to the aforementioned equations 1 to 3.

It has been discovered that cleaning formulations containing non-ammonium and non-HF producing fluoride salts (non-ammonium, quaternary ammonium fluoride salts) show much improved compatibility with sensitive porous and low-κ and high-κ dielectrics and copper metallization. Any suitable non-ammonium producing, non-HF producing fluoride salt can be employed in the cleaning compositions of this invention.

DETAILED DESCRIPTION OF THE INVENTION

The novel back end cleaning composition of this invention will comprise one or more of any suitable non-ammonium producing, non-HF producing fluoride salt (non-ammonium, quaternary ammonium fluoride salt) in a suitable solvent. Among the suitable non-ammonia producing, non-HF producing fluoride salts there may be mentioned tetraalkylammonium fluorides of the formula $(R)_4N^+F^-$, where each R is independently a substituted or unsubstituted alkyl, preferably alkyl of from 1 to 22, and more preferably 1 to 6, carbon atoms (R≠H), such as tetramethylammonium fluoride and tetrabutylammonium fluoride salts; as well as fluoroborates, tetrabutylammonium fluoroborates, aluminum hexafluorides, antimony fluoride and the like.

The non-ammonium producing, non-HF producing fluoride salts show significantly improved compatibility with low-κ dielectrics and copper metallization. Tetraalkylammonium salts, such as tetramethylammonium fluoride (TMAF) can be blended and dissolved in water, certain anhydrous organic solvents, or water and one or more polar, water miscible organic solvents. Selection of a copper/low-κ compatible "friendly" solvent is also advantageous. Any suitable solvent free of strong nucleophiles, such as unhindered primary or secondary amines, is preferably employed. Preferred solvents do not include unhindered nucleophiles, and include for example, such as dimethyl sulfoxide (DMSO), sulfolane (SFL), dimethyl piperidone, 1-(2-hydroxyethyl)-2-pyrrolidinone (HEP), 1-methyl-2-pyrrolidinone and dimethylacetamide and the like. Polar nitrile-containing solvents, such as acetonitrile, isobutylnitrile and the like, can be especially advantageous.

Moreover, whereas anhydrous ammonium fluoride is practically insoluble in most organic solvents, in contradistinction, tetraalkylammonium fluoride salts, such as for example tetramethylammonium fluoride (TMAF), can be blended and completely dissolved in organic solvents, such as for example 1-(2-hydroxyethyl)-2-pyrrolidinone (HEP). Thus, a very simple, completely anhydrous, and effective cleaning compositions for cleaning photoresist and ash residues from substrates having a low-κ dielectric and copper metallization can be readily prepared. An example of such completely anhydrous cleaning composition is 50 parts by weight HEP and 0.8 parts by weight TMAF.

Additionally, while not required by the fluoride salt-containing cleaning compositions of this invention, it may in some instances be desirable to optionally include in the cleaning compositions one or more "corrosion inhibiting solvent", i.e., a solvent compound that has at least two sites capable of complexing with metal is employed.

Preferred as such corrosion inhibiting solvents are compounds having two or more sites capable of complexing with a metal and having one of the two following general formulae:

$$W-(CR_1R_2)_{n1}-X-[(CR_1R_2)_{n2}-Y]_z$$

or $$T-[(CR_3R_4)_m-Z]_y$$

where W and Y are each independently selected from =O, —OR, —O—C(O)—R, —C(O)—, —C(O)—R, —S, —S(O)—R, —SR, —S—C(O)—R, —S(O)$_2$—R, —S(O)$_2$, —N, —NH—R, —NR$_1$R$_2$, —N—C(O)—R, —NR$_1$—C(O)—R$_2$, —P(O), —P(O)—OR and —P(O)—(OR)$_2$; X is alkylene, cycloalkylene or cycloalkylene containing one or more hetero atoms selected from O, S, N and P atoms, and arylene or arylene containing one or more hetero atoms selected from O, S, N and P atoms; each R, R$_1$ and R$_2$ are each independently selected from hydrogen, alkyl, cycloalkyl or cycloalkyl containing one or more hetero atoms selected from O, S, N and P atoms, and aryl or aryl containing one or more hetero atoms selected from O, S, N and P atoms; each of n1 and n2 is independently an integer of from 0 to 6; and z is an integer of from 1 to 6 when X is alkylene, cycloalkylene or arylene; and z is an integer of from 0 to 5 when X is cycloalkylene containing one or more hetero atoms selected from O, S, N and P atoms or arylene containing one or more hetero atoms selected from O, S, N and P atoms; T is selected from —O, —S, —N and —P; Z is selected from hydrogen, —OR$_5$, —N(R$_5$)$_2$, and —SR$_5$; each of R$_3$, R$_4$ and R$_5$ are each independently selected from hydrogen, alkyl, cycloalkyl or cycloalkyl containing one or more hetero atoms selected from O, S, N and P atoms, and aryl or aryl containing one or more hetero atoms selected from O, S, N and P atoms; m is an integer of from 0 to 6 and y is an integer of from 1 to 6. Such corrosion inhibiting solvents may optionally be present in the compositions of this invention in an amount of from about 0 to about 80, preferably from about 0 to about 50, and most preferably from about 5 to about 40%, by weight.

In the above definitions alkyl and alkylene are preferably of from 1 to 6 carbon atoms, more preferably of from 1 to 3 carbon atoms, cycloalkyl and cycloalkylene preferably contain from 3 to 6 carbon atoms, and aryl and arylene preferably contain from about 3 to 14 carbon atoms, more preferably from about 3 to 10 carbon atoms. Alkyl is preferably methyl, ethyl or propyl; alkylene is preferably methylene, ethylene or propylene; aryl is preferably phenyl; arylene is preferably phenylene; hetero-substituted cycloalkyl is preferably dioxyl, morpholinyl and pyrrolidinyl; and hetero-substituted aryl is preferably pyridinyl.

Some suitable examples are of such corrosion inhibiting solvents include, for example, but are not limited to ethylene glycol, diethylene glycol, glycerol, diethylene glycol dimethyl ether, monoethanolamine, diethanolamine, triethanolamine, N,N-dimethylethanolamine, 1-(2-hydroxyethyl)-2-pyrrolidinone, 4-(2-hydroxyethyl)morpholine, 2-(methylamino)ethanol, 2-amino-2-methyl-1-propanol, 1-amino-2-propanol, 2-(2-aminoethoxy)-ethanol, N-(2-hydroxyethyl)acetamide, N-(2-hydroxyethyl) succinimide and 3-(diethylamino)-1,2-propanediol.

While previous attempts to control or inhibit metal corrosion have involved careful controlling of pH and/or using other corrosion inhibiting compounds, such as benzotriazole (BT), at relatively low concentrations of <2% by weight, it has been discovered that unexpected, significant improvement in controlling copper metal corrosion can be provided by the cleaning compositions of this invention without the need for such corrosion inhibiting compounds. However, if desired such corrosion inhibiting compounds may optionally be present in the cleaning compositions of this invention. Examples of such other corrosion inhibiting compounds include for example benzotriazole, and aryl compounds containing 2 or more OH or OR groups, where R is alkyl or aryl, such as for example, catechol, pyrogallol, resorcinol and the like. Such other metal corrosion inhibiting compounds may optionally be present in an amount of from about 0 to about 40% by weight.

The cleaning compositions may also contain surfactants, such as for example dimethyl hexynol (Surfynol-61), ethoxylated tetramethyl decynediol (Surfynol-465), polytetrafluoroethylene cetoxypropylbetaine (Zonyl FSK), (Zonyl FSH) and the like.

Any suitable metal ion-free silicate may be used in the compositions of the present invention. The silicates are preferably quaternary ammonium silicates, such as tetraalkyl ammonium silicate (including hydroxy- and alkoxy-containing alkyl groups generally of from 1 to 4 carbon atoms in the alkyl or alkoxy group). The most preferable metal ion-free silicate component is tetramethyl ammonium silicate. Other suitable metal ion-free silicate sources for this invention may be generated in-situ by dissolving any one or more of the following materials in the highly alkaline cleaner. Suitable metal ion-free materials useful for generating silicates in the cleaner are solid silicon wafers, silicic acid, colloidal silica, fumed silica or any other suitable form of silicon or silica. Metal silicates such as sodium metasilicate may be used but are not recommended due to the detrimental effects of metallic contamination on integrated circuits. The silicates may be present in the composition in an amount of from about 0 to 10 wt. %, preferably in an amount of from about 0.1 to about 5 wt. %.

The compositions of the present invention may also be formulated with suitable metal chelating agents to increase the capacity of the formulation to retain metals in solution and to enhance the dissolution of metallic residues on the wafer substrate. The chelating agent will generally be present in the compositions in an amount of from about 0 to 5 wt. %, preferably from an amount of from about 0.1 to 2 wt. %. Typical examples of chelating agents useful for this purpose are the following organic acids and their isomers and salts: (ethylenedinitrilo)tetraacetic acid (EDTA), butylenediaminetetraacetic acid, (1,2-cyclohexylenedinitrilo)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine. Preferred chelating agents are aminocarboxylic acids such as EDTA, CyDTA and aminophosphonic acids such as EDTMP.

The cleaning compositions of this invention containing the non-ammonium producing, non-HF producing salts can be formulated into aqueous, semi-aqueous or organic solvent-based compositions. The non-ammonium producing, non-HF producing salts can be used with any suitable stable solvents, preferably one or more polar organic solvents resistant to strong bases and that do not contain unhindered nucleophiles, such as dimethyl sulfoxide (DMSO), sulfolane (SFL), dimethyl piperidone, HEP, 1-methyl-2-pyrrolidinone and dimethylacetamide and the like. Polar nitrile-containing solvents, such as acetonitrile, isobutylnitrile and the like, can be especially advantageous. The cleaning composition may also optionally contain organic or inorganic acids, preferably weak organic or inorganic acids, hindered amines, hindered alkanolamines, and hindered hydroxylamines, such as triisopropylamine, and other corrosion inhibitors.

Thus, a wide range of processing/operating pH and temperatures can be used to effectively remove and clean photoresist, plasma etch/ash residue, sacrificial light absorbing materials and anti-reflective coatings (ARC) from substrates with porous or low-κ or high-κ dielectrics or copper metallization.

The cleaning compositions of this invention will generally comprise from about 0.05 to about 20 wt. % of the non-ammonium producing, non-HF producing fluoride salts; from about 5 to about 99.95 wt. % water or organic solvent or both water and organic solvent; from about 0 to 80 wt. & corrosion inhibiting solvent; from about 0 to 40 wt. % steric hindered amines or alkanolamines and hydroxylamines; about 0 to 40 wt. % organic or inorganic acids; and about 0 to 40 wt. % other metal corrosion inhibitor compound; about 0 to 5 wt. % of a surfactant; 0 to 10 Wt. % metal ion free silicate compound; and about 0 to 10 wt. % metal chelating agent.

In the following portions of this application the following abbreviations are employed to designate the indicated components.

HEP=1-(2-hydroxyethyl)-2-pyrrolidinone
TMAF=20% tetramethylammonium fluoride
BT=benzotriazole
DMSO=dimethyl sulfoxide
TEA=triethanolamine
SFL=sulfolane
DMPD=dimethyl piperidone
TBAF=75% tetrabutylammonium fluoride
DMAc=dimethyl acetamide
NMP=N-methylpyrrolidone Examples of compositions of this invention are set forth in the following Table 1.

TABLE 1

| COMPONENT | COMPOSITION | PARTS BY WEIGHT | | |
|---|---|---|---|---|
| | | A | B | C |
| HEP | | 90 | 45 | 54 |
| H₂O | | 16 | 15 | |
| TBAF | | 5.75 | | |
| TMAF | | | 15 | |
| Anhydrous TMAF | | | | 0.8 |
| BT | | 0.11 | 0.4 | |
| DMSO | | 15 | | |
| TEA | | | 15 | |

The interlayer dielectric (ILD) etch rates for Composition B of Table 1 against various dielectrics were evaluated by the following test procedure.

The film thickness of the wafer pieces is measured using a Rudolph Interferometer. The wafer pieces (with ILD material deposited on silicon wafers) were immersed in the designated cleaning compositions at the indicated temperature for 30 minutes, followed by rinsing with de-ionized water and drying under nitrogen flow/stream. The thickness was then measured again following the treatment and the etch rates were then calculated based on the change in film thickness, which are produced by the indicated treatments. The results are set forth in Tables 2, 3 and 4.

TABLE 2

Dielectrics Etch rates (Å/min) at 45° C. (30 min)

| Composition | CDO | Black Diamond | SiLK | Coral | FSG | TEOS | FOx-16 | SiN |
|---|---|---|---|---|---|---|---|---|
| B | <1 | <1 | <1 | <1 | — | 3 | <1 | — |

TABLE 3

Dielectrics Etch rates (Å/min) at 55° C. (30 min)

| Composition | CDO | Black Diamond | SiLK | Coral | FSG | TEOS | FOx-16 | SiN |
|---|---|---|---|---|---|---|---|---|
| B | 2 | 6 | <1 | <1 | <1 | — | — | 3 |

TABLE 4

Dielectrics Etch rates (Å/min) at 65° C. (30 min)

| Composition | CDO | Black Diamond | SiLK | Coral | FSG | TEOS | FOx-16 | SiN |
|---|---|---|---|---|---|---|---|---|
| B | 2 | 13 | 5 | 1 | <1 | 1 | — | 2 |

In Tables 2, 3, and 4 the dielectric are as follows.

CDO=carbon doped oxide;

Black Diamond™=brand of carbon doped oxide;

SiLK™=organic polymer;

Coral™=brand of carbon doped oxide;

FSG=fluorinated silicate glass;

TEOS tetraethylorthosilicate;

Fox-16™=flowable oxide (HSQ type); and

SiN=silicon nitride.

The following examples illustrate the excellent Cu compatibility as compared to the relatively poor Al compatibility of the compositions of this invention.

The copper and aluminum etch rates for cleaning compositions of this invention are demonstrated by the etch rate data in the following Tables 5 and 6. The etch rate was determined utilizing the following test procedure.

Pieces of aluminum or copper foil of approximately 13×50 mm were employed. The weight of the foil pieces was measured. After cleaning the foil pieces with 2-propanol, distilled water and acetone and the foil pieces are dried in a drying oven. The cleaned, dried foil pieces were then placed in loosely capped bottles of preheated cleaning compositions of the invention and placed in a vacuum oven for a period of from two to twenty-four hours at the indicated temperature. Following treatment and removal from the oven and bottles, the cleaned foils were rinsed with copious amounts of distilled water and dried in a drying oven for about 1 hour and then permitted to cool to room temperature, and then the etch rate determined based on weight loss or weight change.

TABLE 5

| Parts by Weight of Composition Components | Cu Etch Rate (Å/hour) at 45° C. (24 hour test) | Al Etch Rate (Å/hour) at 45° C. (24 hour test) |
|---|---|---|
| 10:40:10 20% TMAF-SFL-TEA | 46 | 8,100 |
| 10:40:10 20% TMAF-SFL-DMAc | <10 | 4,200 |
| 10:40:10 20% TMAF-SFL-HEP | 15 | 2,800 |
| 10:50 20% TMAF-DMPD | <10 | 8,100 |
| 10:30:20 20% TMAF-SFL-TEA | <10 | 2,300 |
| 10:30:20 20% TMAF-NMP-H$_2$O | <10 | 6,100 |
| 90:15.9:0.11:5.7 HEP-H$_2$O-BT-75% TBAF | <10 | 600 |
| 90:15.9:0.11:7.54 HEP-H$_2$O-BT-20% TMAF | <10 | 1,000 |
| 90:15.9:7.54 HEP-H$_2$O-20% TMAF | <10 | 800 |

TABLE 6

| Parts by Weight of Composition Components | Cu Etch Rate (Å/hour) at 45° C. (24 hour test) | Al Etch Rate (Å/hour) at 45° C. (24 hour test) |
|---|---|---|
| 10:50 20% TMAF- H$_2$O | <10 | 4,500 |
| 10:50 20% TMAF- (2-propanol) | <10 | 1,000 |
| 10:50 20% TMAF-HEP | <10 | 1,200 |
| 10:50 20% TMAF-DMAc | <10 | 5,700 |
| 10:50 20% TMAF-SFL | <10 | 2,600 |
| 10:50 20% TMAF-DMSO | <10 | 3,600 |
| 10:50 20% TMAF-NMP | <10 | 5,700 |

Employing the same procedure the copper etch rate for a composition of this invention was compared to the copper etch rate of a corresponding composition in which ammonium fluoride (NH4F) was employed in place of the tetramethylammonium fluoride component of the composition of the invention. The copper etch rates of the two compositions are presented in TABLE 7.

TABLE 7

| Parts by Weight of Composition Components | pH (10% aqueous) | Cu etch rate (Å/hour) at 65° C. (24 hour test) |
|---|---|---|
| 60:40:5 DMAc-H$_2$O-40% NH$_4$F | 5.1 | 460 |
| 60:40:10 DMAc-H$_2$O-20% TMAF | 4.8 | <10 |

The following example demonstrates the superior compatibility of the non-ammonium, quaternary ammonium fluoride salts of this invention, e.g. TMAF, in comparison to the ammonium based fluoride salts, e.g. ammonium fluoride (NH$_4$F), with sensitive low-κ dielectrics, such as hydrogen silsesquioxane (HSQ) type FOx-15™ flowable oxide. The test procedure is as follows. Wafer samples coated with dielectric films were immersed in a magnetically stirred wet chemical solution (stirring rate 300 rpm), followed by isopropanol and distilled water rinses. The samples were then dried with a nitrogen stream before IR analysis Transmittance IR spectra were obtained with a Nicolet 740 FTIR spectrometer using a deuterated triglycine sulfate (DTGS) detector. Spectra were acquired with 4 cm$^{-1}$ resolution and averaged over 32 scans. Fourier Transform Infrared (FTIR) analysis provides a way of monitoring the structural changes of HSQ dielectrics. The infrared absorption band assignments of typical deposited HSQ films are as follows.

Assignments of Infrared Absorption Bands of HSQ Dielectric

| Absorption Frequencies (cm$^{-1}$) | Band Assignment |
|---|---|
| 2,250 | Si—H Stretch |
| 1,060-1,150 | Si—O—Si Stretch |
| 830-875 | H—Si—O hybrid vibration |

The content of Si—H bonds in HSQ films can be determined by measuring the peak areas of Si—H absorption bands at 2,250 cm$^{-1}$. The use of the silicon wafer's inherent absorption at 650-525 cm$^{-1}$ (from Si—Si lattice bonds and Si—C impurities) as the internal standard/reference resulted in quantitative IR analyses with good precision (relative standard deviation: 2-5%).

For Black Diamond dielectric use the following IR bands:
Si—H: band at 2,100-2,300 cm$^{-1}$;
Si—CH$_3$: band at 1,245-1,300 cm$^{-1}$.
The results are set forth in Tables 8 and 9.

TABLE 8

Compatibility with FOx-15 HSQ type low-κ dielectrics

| Process Conditions; Parts by Weight of Composition Components | % Si—H Remaining after Treatment (by FTIR measurement) | % Film Thickness Remaining after treatment |
|---|---|---|
| 65° C., 15 m; 90:17:0.6:0.11 HEP-H$_2$O-NH$_4$F-BT (Comparative) | <9 | 0 |
| 65° C., 15 m; 90:17:4.28:0.11 HEP-H$_2$O-TBAF-BT | 91 ± 1 | 98 |
| 75° C., 15 m 90:17:4.28:0.11 HEP-H$_2$O-TBAF-BT- | 85.5 ± 1 | 96 |
| 65° C., 15 m; 90:14.5:1.52:0.11 HEP-H$_2$O-TMAF-BT | 84 ± 2 | 93 |
| 65° C., 15 m; 90:6:1.42:0.11 HEP-H$_2$O-TMAF-BT | 81 | 89 |

Original film thickness: 4,500 Å.

TABLE 9

Compatibility with Black Diamond Low-κ Dielectrics

| Process Conditions; Parts by Weight of Composition Components | % Si—H Remaining after Treatment (by FTIR measurement) | % Si—CH$_3$ Remaining after Treatment (by FTIR measurement) | % Film Thickness Remaining after treatment |
|---|---|---|---|
| 65° C., 15 min; 90:17:4.28:0.11 HEP-H$_2$O-TBAF-BT | 91 ± 2 | 101 ± 1 | 99 ± 1 |
| 75° C., 15 min; 90:17:4.28:0.11 | 88 ± 5 | 96 ± 2 | 96 ± 1 |
| HEP-H$_2$O-TBAF-BT | | | |

Original Film Thickness: 5,400 Å.

The cleaning capability of compositions of this invention compared to the cleaning capability of a commercially available cleaning composition (ATMI ST-250) is illustrated in the following tests in which a microelectronic structure that comprised a wafer of the following via structure, namely pTEOS/Coral™ carbon doped oxide/SiN/Coral/SiN/Cu, was immersed in cleaning solutions for the indicated temperature and time, were then water rinsed, dried and then the cleaning determined by SEM inspection. The results are set forth in Table 10.

TABLE 10

| Process Condition and Composition | Cleaning Performance | Substrate Compatibility |
|---|---|---|
| 45° C., 1 min Composition B of Table 1 | 100% Clean; Removed all the residues | 100% compatible with Cu metal, dielectrics and etch stop/barrier layers. |
| 65° C., 4 min Composition B of Table 1 | 100% Clean; Removed all the residues | 100% compatible with Cu metal, dielectrics and etch stop/barrier layers. |
| 65° C., 20 min ATMI ST-250 (a NH$_4$F based cleaner) | Not compatible; Severe attack and remove all the SiN layers. | |

With the foregoing description of the invention, those skilled in the art will appreciate that modifications may be made to the invention without departing from the spirit and scope of thereof. Therefore, it is not intended that the scope of the invention be limited to the specific embodiments illustrated and described.

I claim:

1. A cleaning composition capable of cleaning photoresist or plasma etch or ash residue from a microelectronic substrate having copper metallization and at least one of a porous dielectric, a low-κ or high-κ dielectric, said cleaning composition consisting of:
   from about 0.05 to 20% by weight of one or more tetraalkylammonium fluoride salts of the formula (R)$_4$N$^+$F$^-$ wherein each R is independently a substituted or unsubstituted alkyl group;
   from about 5 to about 99.95% by weight of at least one polar, water miscible, copper/low-κ compatible organic solvent or both water and said at least one polar, water miscible, copper/low-κ compatible organic solvent, wherein said at least one organic solvent is selected from the group consisting of dimethyl sulfoxide, sulfolane, dimethyl piperidone, 1-(2-hydroxyethyl)-2-pyrrolidinone, 1-methyl-2-pyrrolidinone, dimethylacetamide, acetonitrile and isobutylnitrile;
   from about 5 to about 80% by weight of a metal corrosion inhibiting solvent selected from the group consisting of ethylene glycol, diethylene glycol, glycerol, diethylene glycol dimethyl ether, triethanolamine, N,N-dimethylethanolamine, 1-(2-hydroxyethyl)-2-pyrrolidinone, 4-(2-hydroxyethyl)morpholine, 2-(methylamino)ethanol, 2-amino-2-methyl-1-propanol, 1-amino-2-propanol, 2-(2-aminoethoxy)-ethanol, N-(2-hydroxyethyl) acetamide, N-(2-hydroxyethyl) succinimide and 3-(diethylamino)-1,2-propanediol;

from about 0 to 40% by weight of an other metal corrosion inhibitor compound selected from the group consisting of benzotriazole and aryl compounds containing 2 or more OH or OR groups where R is selected from the group consisting of alkyl or aryl groups;

from about 0 to 5% by weight of a surfactant;

from about 0 to 10% by weight of a metal ion free silicate compound; and from about 0 to 5% by weight of a metal chelating agent selected from the group consisting of the organic acids (ethylenedinitrilo)tetraacetic acid (EDTA), butylenediaminetetraacetic acid, (1,2-cyclohexylenedinitrilo)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine, and their isomers and salts.

2. A composition according to claim 1 wherein R of the tetraalkylammonium fluoride is an alkyl group containing 1 to 22 carbon atoms.

3. A composition according to claim 2 wherein R of the tetraalkylammonium fluoride is an alkyl group of from 1 to 6 carbon atoms.

4. A composition according to claim 1 wherein the tetraalkylammonium fluoride is a tetramethylammonium fluoride.

5. A composition according to claim 1 wherein the solvent comprises water and said at least one polar, water miscible, copper/low-κ compatible organic solvent selected from the group consisting of 1-(2-hydroxyethyl)-2-pyrrolidinone dimethyl sulfoxide, sulfolane, and dimethyl piperidone.

6. A composition according to claim 1 wherein the cleaning composition consists of tetramethylammonium fluoride, dimethyl sulfoxide, 1-(2-hydroxyethyl)-2-pyrrolidinone, water, triethanolamine and benzotriazole.

* * * * *